(12) United States Patent
Sakakura et al.

(10) Patent No.: US 10,034,388 B2
(45) Date of Patent: Jul. 24, 2018

(54) SUSPENSION BOARD WITH CIRCUIT AND PRODUCING METHOD THEREOF

(71) Applicant: NITTO DENKO CORPORATION, Osaka (JP)

(72) Inventors: Takatoshi Sakakura, Osaka (JP); Tomoaki Okuno, Osaka (JP); Takahiro Takano, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/664,300

(22) Filed: Jul. 31, 2017

(65) Prior Publication Data

US 2018/0070457 A1    Mar. 8, 2018

(30) Foreign Application Priority Data

Sep. 7, 2016    (JP) ................. 2016-174435

(51) Int. Cl.
| | | |
|---|---|---|
| *H05K 1/18* | (2006.01) | |
| *H05K 3/34* | (2006.01) | |
| *H05K 1/02* | (2006.01) | |

(52) U.S. Cl.
CPC ............. *H05K 3/34* (2013.01); *H05K 1/0296* (2013.01); *H05K 1/18* (2013.01); *H05K 2201/09209* (2013.01)

(58) Field of Classification Search
CPC .. H05K 1/00; H05K 1/02; H05K 1/05; H05K 1/11; H05K 1/18; H05K 1/115; H05K 3/06; H05K 3/10; H05K 3/18; H05K 3/28; H05K 3/30; H05K 3/40; H05K 3/42; G11B 5/48; G11B 5/60

USPC ....... 174/260, 250, 251, 255, 261, 264, 268; 29/846; 427/97.3, 97.4

See application file for complete search history.

(56) References Cited

U.S. PATENT DOCUMENTS

| | | | |
|---|---|---|---|
| 2011/0149440 A1 | 6/2011 | Uematsu et al. | |
| 2012/0087041 A1* | 4/2012 | Ohsawa ............ | G11B 5/4826 360/234.5 |
| 2012/0247824 A1* | 10/2012 | Ohsawa ............ | G11B 5/486 174/264 |

(Continued)

FOREIGN PATENT DOCUMENTS

| | | |
|---|---|---|
| JP | 2011-129220 A | 6/2011 |
| JP | 2014-106993 A | 6/2014 |

(Continued)

*Primary Examiner* — Xiaoliang Chen
(74) *Attorney, Agent, or Firm* — Edwards Neils, LLC; Jean C. Edwards, Esq.

(57) ABSTRACT

A suspension board with circuit includes a metal supporting layer, a base insulating layer disposed at one side in a thickness direction of the metal supporting layer, a conductive pattern including a wire disposed at one side in the thickness direction of the base insulating layer and a terminal exposed from the metal supporting layer and the base insulating layer when viewed from the other side in the thickness direction, a piezoelectric element disposed at the other side in the thickness direction with respect to the terminal and including an element terminal electrically connected to the terminal, and a solder layer disposed between the terminal and the element terminal. The solder layer has a solder composition containing Sn, Ag, and Cu, and the solder layer has a thickness in the thickness direction of 50 μm or less.

3 Claims, 10 Drawing Sheets

(56) References Cited

U.S. PATENT DOCUMENTS

| | | | |
|---|---|---|---|
| 2013/0014976 A1* | 1/2013 | Ishigaki | H05K 1/189 174/255 |
| 2013/0020112 A1* | 1/2013 | Ohsawa | G11B 5/4853 174/255 |
| 2013/0021699 A1* | 1/2013 | Ohsawa | G11B 5/4833 360/245.8 |
| 2013/0133939 A1* | 5/2013 | Ishii | H05K 1/115 174/262 |
| 2013/0248233 A1* | 9/2013 | Kanezaki | H05K 1/18 174/260 |
| 2013/0319743 A1* | 12/2013 | Ishii | H05K 1/0296 174/260 |
| 2013/0319748 A1* | 12/2013 | Ishii | H05K 1/0298 174/262 |
| 2014/0160599 A1* | 6/2014 | Higuchi | G11B 5/486 360/294.4 |
| 2015/0138739 A1* | 5/2015 | Hishiki | H05K 3/305 361/760 |
| 2015/0156892 A1* | 6/2015 | Tanabe | H05K 3/4661 205/125 |
| 2015/0179196 A1* | 6/2015 | Okuno | G11B 5/4826 360/234.6 |
| 2015/0305156 A1* | 10/2015 | Fujimura | H05K 1/056 174/260 |
| 2015/0380030 A1* | 12/2015 | Sakakura | G11B 5/4873 174/251 |
| 2015/0382451 A1* | 12/2015 | Tanabe | H05K 3/28 174/251 |
| 2016/0007458 A1* | 1/2016 | Terada | H05K 1/181 174/268 |
| 2016/0035968 A1* | 2/2016 | Sakakura | H01L 41/313 29/25.35 |
| 2016/0081185 A1* | 3/2016 | Ishii | H05K 1/0296 174/255 |
| 2016/0105954 A1* | 4/2016 | Sugimoto | H05K 1/0271 174/251 |
| 2016/0111115 A1* | 4/2016 | Fujimura | G11B 5/4826 174/251 |
| 2016/0133284 A1* | 5/2016 | Terada | G11B 5/486 360/234.3 |
| 2016/0135296 A1* | 5/2016 | Takano | B23K 1/0056 361/760 |
| 2016/0239055 A1* | 8/2016 | Terada | G11B 5/4826 |
| 2016/0262265 A1* | 9/2016 | Tanabe | H05K 1/11 |
| 2017/0042024 A1* | 2/2017 | Sugimoto | H05K 1/05 |

FOREIGN PATENT DOCUMENTS

| | | |
|---|---|---|
| JP | 2015-076107 A | 4/2015 |
| JP | 2015-082328 A | 4/2015 |

\* cited by examiner

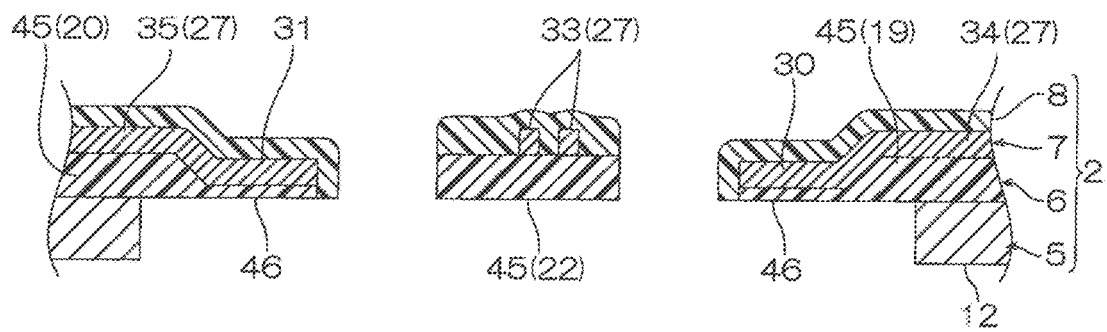
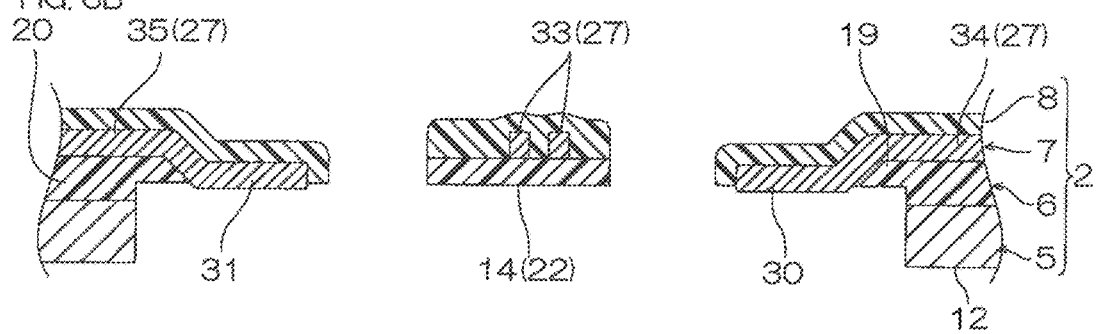
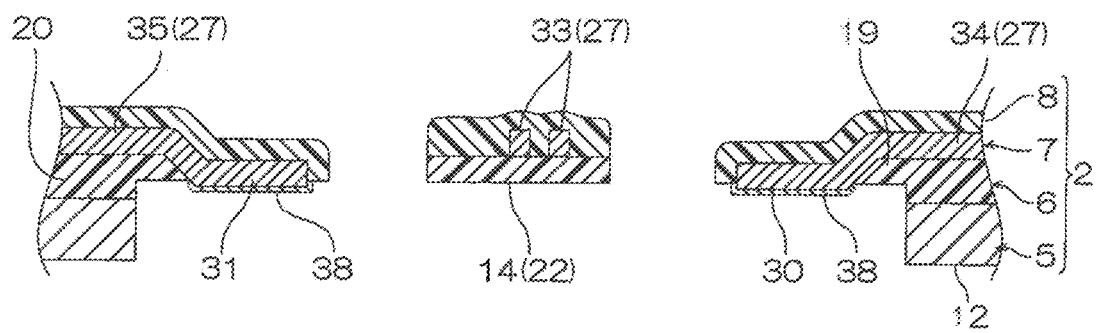

SUSPENSION BOARD WITH CIRCUIT AND PRODUCING METHOD THEREOF

CROSS-REFERENCE TO RELATED APPLICATION

The present application claims priority from Japanese Patent Application No. 2016-174435 filed on Sep. 7, 2016, the contents of which are hereby incorporated by reference into this application.

BACKGROUND OF THE INVENTION

Field of the Invention

The present invention relates to a suspension board with circuit, and a producing method thereof to be more specific, a suspension board with circuit to be used for a hard disk drive, and a producing method thereof.

Description of Related Art

A suspension board with circuit on which a head slider, and a piezoelectric element that is extendable and/or contractable so as to displace the head slider are mounted has been known. The piezoelectric element is connected to a terminal provided in the suspension board with circuit by solder.

For example, a suspension in which a piezoelectric element is connected to an element connecting terminal of a suspension board with a Sn—Bi solder material has been proposed (ref: for example, Japanese Unexamined Patent Publication No. 2014-106993).

The suspension is produced as follows: after the Sn—Bi solder material is disposed on the element connecting terminal by a solder jet method, the piezoelectric element is disposed so as to be in contact with the solder material; next, the solder material is melted by reflow; and the piezoelectric element is connected to the element connecting terminal.

SUMMARY OF THE INVENTION

In the method for producing a suspension described in Japanese Unexamined Patent Publication No. 2014-106993, there may be a case where the piezoelectric element deviates from a predetermined position, and by the subsequent reflow, the piezoelectric element is connected to the element connecting terminal with the solder material in a state where the piezoelectric element deviates from the predetermined position.

By taking such a case into account, it has been considered that the piezoelectric element is self-aligned using the surface tension of the solder material that is melted at the time of reflow, and improvement of the position accuracy of the piezoelectric element is achieved.

However, to ensure the surface tension of the solder material that is necessary for the self-alignment of the piezoelectric element, a large amount of solder material is required. Then, the thickness of the solder material increases, and therefore, the thickness of a portion on which the piezoelectric element is mounted in the suspension increases.

Thus, in the suspension described in Japanese Unexamined Patent Publication No. 2014-106993, it is difficult to achieve improvement of the position accuracy of the piezoelectric element, and achieve a reduction in the thickness of the portion on which the piezoelectric element is mounted.

Meanwhile, there is a strict size limit to the thickness of the portion on which the piezoelectric element is mounted in the suspension so as to suppress contact of the piezoelectric element with a peripheral member thereof (for example, magnetic disk, load beam, or the like) in a state where the suspension is mounted on a hard disk drive.

The present invention provides a suspension board with circuit that is capable of improving the position accuracy of a piezoelectric element and capable of achieving a reduction in the thickness of a portion on which the piezoelectric element is mounted, and a producing method thereof.

The present invention [1] includes a suspension board with circuit including a metal supporting layer, a base insulating layer disposed at one side in a thickness direction of the metal supporting layer, a conductive pattern including a wire disposed at one side in the thickness direction of the base insulating layer and a terminal exposed from the metal supporting layer and the base insulating layer when viewed from the other side in the thickness direction, a piezoelectric element disposed at the other side in the thickness direction with respect to the terminal and including an element terminal electrically connected to the terminal, and a solder layer disposed between the terminal and the element terminal, wherein the solder layer has a solder composition containing Sn, Ag, and Cu, and the solder layer has a thickness in the thickness direction of 50 μm or less.

According to the structure, the solder layer has a solder composition containing Sn, Ag, and Cu (hereinafter, referred to as a Sn—Ag—Cu solder composition), so that compared to a case where the solder layer is the Sn—Bi solder composition, improvement of the surface tension of the solder composition can be achieved, and self-alignment of the piezoelectric element can be achieved with a small amount of solder composition.

Thus, improvement of the position accuracy of the piezoelectric element can be achieved, the thickness of the solder layer can be reduced to the above-described value or less, and therefore, a reduction in the thickness of the portion on which the piezoelectric element is mounted can be achieved.

The present invention [2] includes the suspension board with circuit described in the above-described [1], wherein the two terminals are disposed at spaced intervals to each other in a direction perpendicular to the thickness direction, the two element terminals corresponding to the two terminals are disposed at spaced intervals to each other in the direction perpendicular to the thickness direction, the outer-side end edge in the direction perpendicular to the thickness direction of the terminal generally coincides with that in the direction perpendicular to the thickness direction of the element terminal in the direction perpendicular to the thickness direction, and a size in the direction perpendicular to the thickness direction of the terminal with respect to that in the direction perpendicular to the thickness direction of the element terminal is 30% or more and 100% or less.

According to the structure, the outer-side end edge in the direction perpendicular to the thickness direction of the terminal generally coincides with that in the direction perpendicular to the thickness direction of the element terminal in the direction perpendicular to the thickness direction, and the size in the direction perpendicular to the thickness direction of the terminal with respect to that in the direction perpendicular to the thickness direction of the element terminal is within the above-described range, so that improvement of the position accuracy of the piezoelectric element can be surely achieved.

Among all, when the size in the direction perpendicular to the thickness direction of the terminal with respect to that in the direction perpendicular to the thickness direction of the element terminal is below 100%, the center of the terminal is positioned at the outer side in the direction perpendicular to the thickness direction with respect to the center of the element terminal. Thus, when the piezoelectric element is self-aligned, the element terminal is pulled outwardly in the direction perpendicular to the thickness direction. Therefore, improvement of the position accuracy of the piezoelectric element can be further more surely achieved.

The present invention [3] includes the suspension board with circuit described in the above-described [1] or [2], wherein the terminal is next to the base insulating layer in the direction perpendicular to the thickness direction and extends along the direction perpendicular to the thickness direction so as to go away from the base insulating layer next thereto.

According to the structure, the terminal extends so as to go away from the base insulating layer next thereto. That is, the terminal and the base insulating layer are not disposed to be overlapped with each other. Thus, a reduction in the thickness of the portion on which the piezoelectric element is mounted can be surely achieved.

The present invention [4] includes a method for producing a suspension board with circuit including the steps of preparing a suspension board including a metal supporting layer, a base insulating layer disposed at one side in a thickness direction of the metal supporting layer, and a conductive pattern including a wire disposed at one side in the thickness direction of the base insulating layer and a terminal exposed from the metal supporting layer and the base insulating layer when viewed from the other side in the thickness direction; disposing a solder composition containing Sn, Ag, and Cu on the terminal; disposing a piezoelectric element including an element terminal so that the element terminal is in contact with the solder composition; and subjecting the piezoelectric element to self-alignment by heating the solder composition to be melted and connecting the element terminal to the terminal.

According to the method, the Sn—Ag—Cu solder composition is disposed on the terminal; next, the piezoelectric element is disposed so that the element terminal is in contact with the solder composition; subsequently, the piezoelectric element is self-aligned by heating the solder composition to be melted; and the element terminal is connected to the terminal.

That is, the solder layer has the Sn—Ag—Cu solder composition, so that improvement of the surface tension of the solder composition can be achieved, and the self-alignment of the piezoelectric element can be achieved with a small amount of solder composition.

Thus, the suspension board with circuit in which the position accuracy of the piezoelectric element is excellent, and the thickness of the portion on which the piezoelectric element is mounted is reduced can be smoothly produced.

BRIEF DESCRIPTION OF THE DRAWINGS

FIG. 6A, subsequent to FIG. 5D, shows a step of trimming the supporting board.

FIG. 6B, subsequent to FIG. 6A, shows a step of exposing the first terminal and the second terminal by removing the thin portion of the base insulating layer.

FIG. 6C, subsequent to FIG. 6B, shows a step of forming a plating layer on the first terminal and the second terminal.

DETAILED DESCRIPTION OF THE INVENTION

Figure 1:
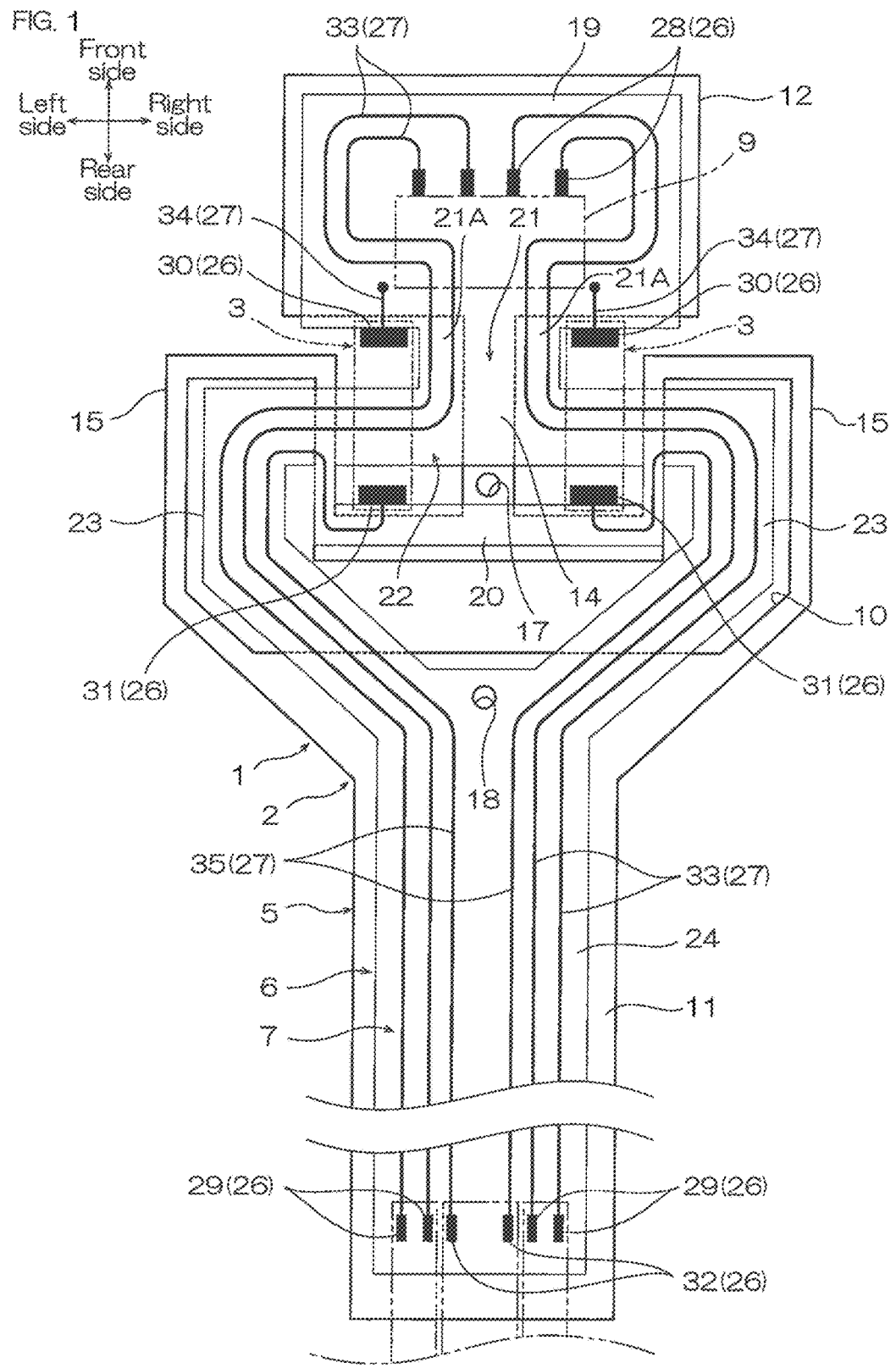
FIG. 1 shows a plan view of a first embodiment of a suspension board with circuit of the present invention, and shows a state in which a cover insulating layer is removed.

In FIG. 1, the thickness direction of the paper surface is an up-down direction (first direction, thickness direction), the near side of the paper surface is an upper side (one side in the first direction, one side in the thickness direction), and the far side of the paper surface is a lower side (the other side in the first direction, the other side in the thickness direction).

In FIG. 1, the up-down direction of the paper surface is a front-rear direction (second direction perpendicular to the first direction, direction perpendicular to the thickness direction), the upper side of the paper surface is a front side (one side in the second direction, one side in the direction perpendicular to the thickness direction), and the lower side of the paper surface is a rear side (the other side in the second direction, the other side in the direction perpendicular to the thickness direction).

In FIG. 1, the right-left direction of the paper surface is a right-left direction (third direction perpendicular to both directions of the first direction and the second direction, width direction perpendicular to both directions of the thickness direction and the direction perpendicular to the thickness direction), the right side of the paper surface is a right side (one side in the third direction, one side in the width direction), and the left side of the paper surface is a left side (the other side in the third direction, the other side in the width direction). To be specific, the directions follow direction arrows described in each view.

1. Suspension Board with Circuit

Hereinafter, a suspension board with circuit 1 that is a first embodiment of a suspension board with circuit of the present invention is described with reference to FIGS. 1 to 4B.

Figure 4A:
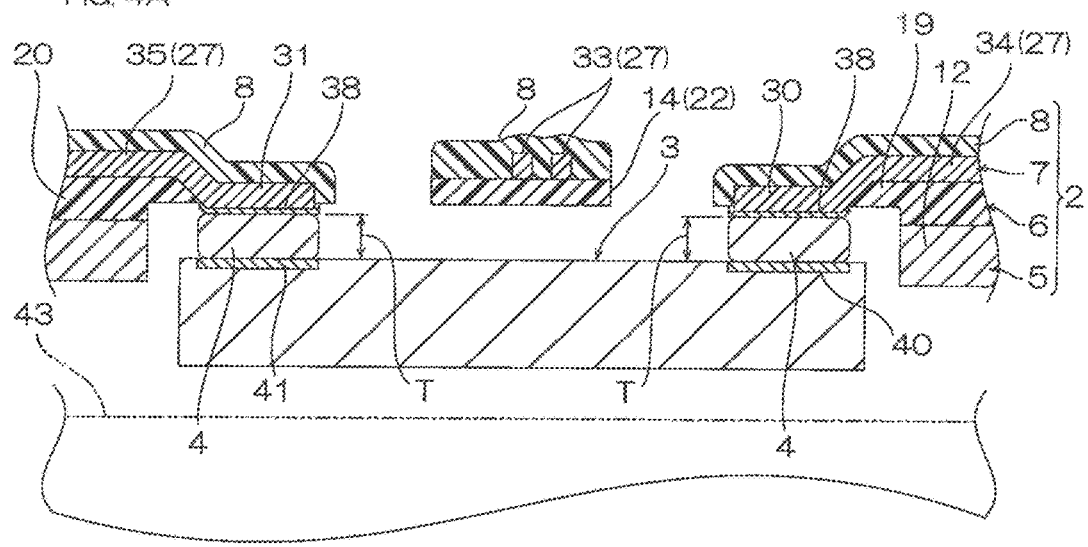
FIG. 4A shows an A-A cross-sectional view of the first terminal and a second terminal shown in FIG. 2.

As shown in FIG. 1, the suspension board with circuit 1 is a suspension board with circuit on which a piezoelectric element is mounted, and includes a suspension board 2, piezoelectric elements 3 that are mounted on the suspension board 2, and a solder layer 4 (ref: FIG. 4A) that connects the suspension board 2 to the piezoelectric elements 3.

(1-1) Suspension Board

The suspension board 2 has a generally flat belt shape extending in the front-rear direction. As shown in FIG. 4A, the suspension board 2 has a laminate structure, and sequentially includes a supporting board 5 as one example of a metal supporting layer, a base insulating layer 6, a conductive pattern 7, and a cover insulating layer 8 from the lower side upwardly. In FIG. 1, for convenience, the cover insulating layer 8 is omitted.

Figure 2:
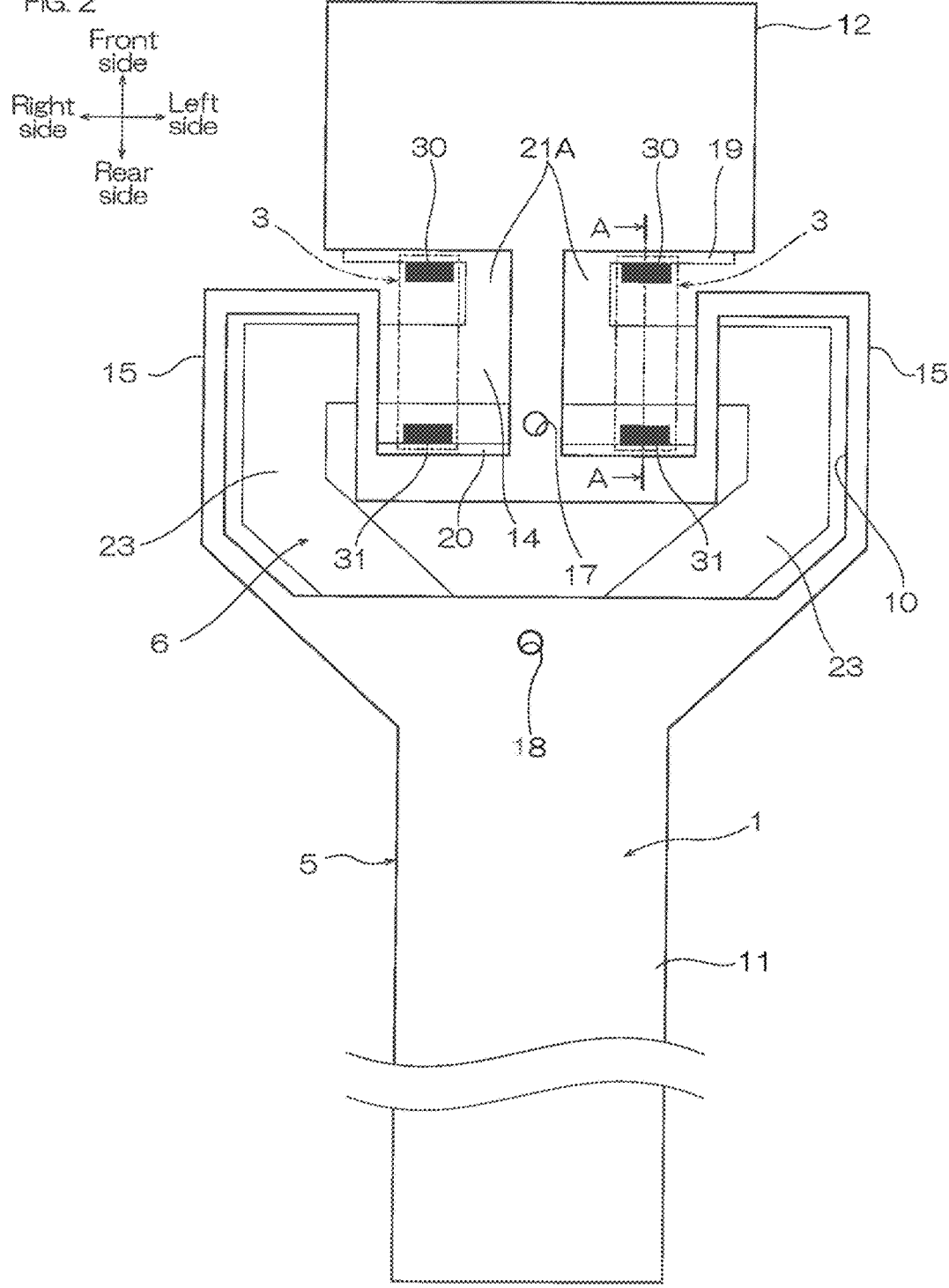
FIG. 2 shows a bottom view of the suspension board with circuit shown in FIG. 1.

As shown in FIG. 2, the supporting board 5 extends in the front-rear direction. The supporting board 5 includes a stage 12, two outriggers 15, and an external connecting portion 11.

The stage 12 is the front end portion of the supporting board 5, and has a generally H-shape when viewed from the top. To be more specific, each of the front-side portion and the rear-side portion of the stage 12 has a generally rectangular shape when viewed from the top extending in the right-left direction, and the front-side portion and the rear-side portion are connected to each other by the central portion having a generally rectangular shape extending in the front-rear direction.

The stage 12 has a first reference hole 17. The first reference hole 17 is formed in the central portion in the front-rear direction of the stage 12, and is positioned at the center in the right-left direction of the supporting board 5. The first reference hole 17 has a generally circular shape when viewed from the top, and passes through the stage 12 in the up-down direction.

Each of the two outriggers 15 has a generally U-shape having an opening rearwardly. Each of the outriggers 15 connects the end portion in the right-left direction of the rear-side portion of the stage 12 to the front end portion of the external connecting portion 11.

In this manner, an opening portion 10 which has a recessed shape having an opening forwardly is formed in the supporting board 5. The opening portion 10 is defined by the rear-side portion of the stage 12, the two outriggers 15, and the front end portion of the external connecting portion 11.

The external connecting portion 11 is a portion that is supported by a load beam 43 (described later), and is disposed at spaced intervals to the rear side of the stage 12. The external connecting portion 11 has a generally flat plate shape extending in the front-rear direction.

The external connecting portion 11 has a second reference hole 18. The second reference hole 18 is formed at the center in the right-left direction in the front end portion of the external connecting portion 11, and is positioned at the center in the right-left direction of the supporting board 5.

The second reference hole 18 has a generally circular shape when viewed from the top, and passes through the external connecting portion 11 in the up-down direction.

The supporting board 5 is, for example, formed from a metal material such as stainless steel, 42-alloy, aluminum, copper-beryllium, and phosphor bronze. Preferably, the supporting board 5 is formed from stainless steel. The supporting board 5 has a thickness of, for example, 10 μm or more, preferably 15 μm or more, and for example, 35 μm or less, preferably 25 μm or less.

As shown in FIG. 4A, the base insulating layer 6 is disposed on the upper surface (one side in the thickness direction) of the supporting board 5, and as shown in FIG. 1, is provided as a predetermined pattern corresponding to the conductive pattern 7. The base insulating layer 6 includes a first stage base 19, a second stage base 22, a third stage base 20, two outrigger bases 23, and an external connecting base 24.

The first stage base 19 has a generally rectangular shape when viewed from the top, and is disposed on the upper surface of the front-side portion of the stage 12. The rear end edge of the first stage base 19 is positioned at the rear side with respect to the rear end edge of the front-side portion of the stage 12.

The second stage base 22 is disposed at the rear side with respect to the first stage base 19. The second stage base 22 has a generally T-shape when viewed from the top, and includes a belt-shaped portion 14 and a bridged portion 21.

The belt-shaped portion 14 has a flat belt shape extending in the right-left direction, and is disposed at spaced intervals to the rear side of the first stage base 19. Both end portions in the right-left direction of the belt-shaped portion 14 are positioned at the inside of the opening portion 10 when viewed from the upper side.

The bridged portion 21 is disposed between the first stage base 19 and the belt-shaped portion 14, and is disposed on the central portion of the stage 12. The bridged portion 21 connects the central portion in the right-left direction of the rear end portion of the first stage base 19 to the central portion in the right-left direction of the front end portion of the belt-shaped portion 14.

A size in the right-left direction of the bridged portion 21 is larger than that in the right-left direction of the central portion of the stage 12. Each of both end edges in the right-left direction of the bridged portion 21 is disposed at the outer side in the right-left direction with respect to both end edges in the right-left direction of the central portion of the stage 12. That is, the bridged portion 21 has two outer-side portions 21A that are positioned at the outer side in the right-left direction with respect to the central portion of the stage 12.

The third stage base 20 is disposed at spaced intervals to the rear side of the belt-shaped portion 14 of the second stage base 22, and is disposed on the upper surface of the rear-side portion of the stage 12. The third stage base 20 has a generally rectangular shape when viewed from the top extending in the right-left direction. The front end edge of the third stage base 20 is positioned at the front side with respect to the front end edge of the rear-side portion of the stage 12. Both end portions in the right-left direction of the third stage base 20 continue to the belt-shaped portion 14 on each of the outriggers 15.

The two outrigger bases 23 are positioned at the inside of the opening portion 10 when viewed from the upper side, and connect each of both end portions in the right-left direction of the belt-shaped portion 14 to the front end portion of the external connecting base 24.

The external connecting base 24 has a rectangular shape when viewed from the top extending in the front-rear direction, and is disposed on the upper surface of the external connecting portion 11.

The base insulating layer 6 is, for example, formed from a synthetic resin such as polyimide resin, polyamide imide resin, acrylic resin, polyether resin, nitrile resin, polyether sulfone resin, polyethylene terephthalate resin, polyethylene naphthalate resin, and polyvinyl chloride resin. Preferably, the base insulating layer 6 is formed from a polyimide resin.

The base insulating layer 6 has a thickness of, for example, 1 µm or more, preferably 3 µm or more, and for example, 25 µm or less, preferably 15 µm or less.

The conductive pattern 7 includes a terminal group 26 and a wire 27.

The terminal group 26 includes magnetic head terminals 28, external connecting terminals 29, first terminals 30 and second terminals 31 as one example of a terminal, and power source terminals 32.

The magnetic head terminals 28 are terminals to be connected to a terminal (not shown) of a slider 9. The plurality (four pieces) of magnetic head terminals 28 are disposed in alignment at spaced intervals to each other in the right-left direction on the first stage base 19.

The external connecting terminals 29 correspond to the plurality of magnetic head terminals 28, and the number thereof is the same as that of the magnetic head terminal 28. The plurality (four pieces) of external connecting terminals 29 are disposed in alignment at spaced intervals to each other in the right-left direction in the rear end portion of the external connecting base 24.

The first terminals 30 and the second terminals 31 are terminals to be connected to first element terminals 40 and second element terminals 41 (ref: FIG. 4A) of a piezoelectric element 3. The number of the first terminal 30 and the second terminal 31 is the same as that of the piezoelectric element 3. Thus, when "n" piezoelectric elements 3 are provided on the suspension board with circuit 1, "n" pairs of first terminal 30 and second terminal 31 are provided.

In the embodiment, the suspension board with circuit 1 is provided with the two piezoelectric elements 3, so that the two pairs of first terminal 30 and second terminal 31 are provided. The two pairs of first terminal 30 and second terminal 31 are disposed at spaced intervals to each other in the right-left direction between the first stage base 19 and the third stage base 20.

The first terminal 30 and the second terminal 31 are disposed at spaced intervals to each other in the front-rear direction. The belt-shaped portion 14 of the second stage base 22 is disposed between the first terminal 30 and the second terminal 31 in the front-rear direction.

Figure 3:
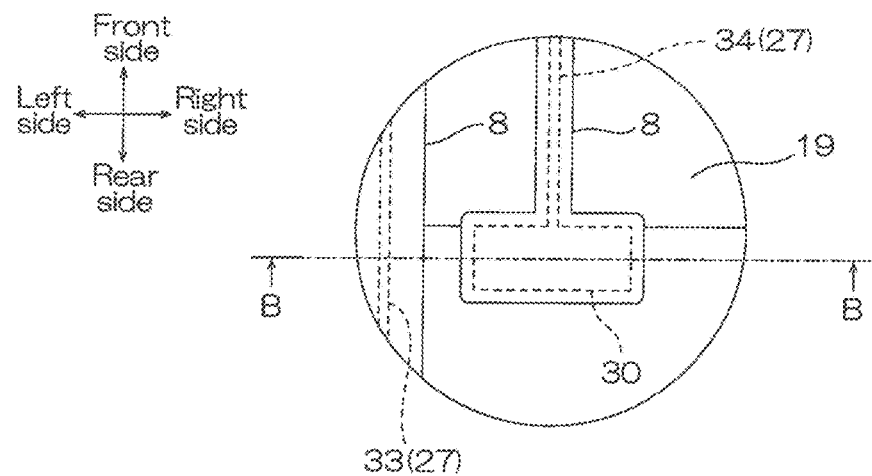
FIG. 3 shows an enlarged view of a first terminal shown in FIG. 1.

As shown in FIGS. 3 and 4A, the first terminal 30 has a generally rectangular shape when viewed from the top extending in the right-left direction. The first terminal 30 is next to the rear side with respect to the rear end edge of the first stage base 19, and is disposed at spaced intervals to the front side of the belt-shaped portion 14. That is, the first terminal 30 is next to the first stage base 19 in the front-rear direction.

The first terminal 30 extends rearwardly along the front-rear direction so as to go away from the first stage base 19. The rear end portion, and both end portions in the right-left direction of the first terminal 30 are free end portions, and are not connected to another portion of the conductive pattern 7.

Figure 4B:
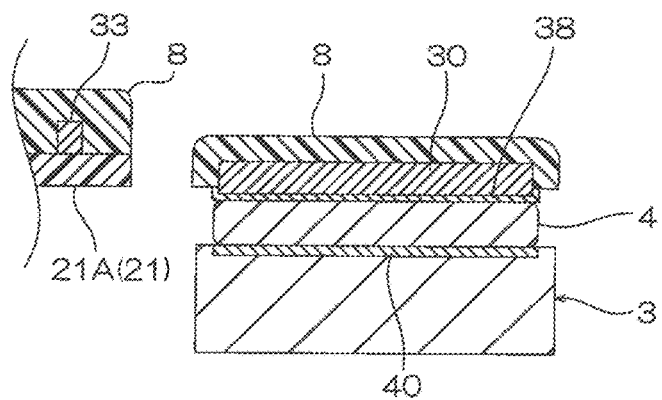
FIG. 4B shows a B-B cross-sectional view of the first terminal shown in FIG. 3.

As shown in FIG. 4B, the first terminal 30 is disposed at slightly spaced intervals to the outer side in the right-left direction of the outer-side portion 21A of the bridged portion 21.

As shown in FIGS. 4A and 4B, the first terminal 30 is exposed from the supporting board 5 and the base insulating layer 6 when viewed from the lower side (the other side in the thickness direction) (ref: FIG. 6C).

A size in the front-rear direction of the first terminal 30 with respect to that in the front-rear direction of the first element terminal 40 (described later) is, for example, 15% or more, preferably 30% or more, and for example, 130% or less, preferably 120% or less, further more preferably 100% or less, particularly preferably 80% or less, especially preferably 70% or less.

A size in the right-left direction of the first terminal 30 with respect to that in the front-rear direction of the first terminal 30 is, for example, 1.2 times or more, preferably 1.5 times or more, further more preferably twice or more, and for example, 10 times or less, preferably 8 times or less, further more preferably 4 times or less.

A size in the right-left direction of the first terminal 30 with respect to that in the right-left direction of the first element terminal 40 (described later) is, for example, 60% or more, preferably 80% or more, and for example, 120% or less, preferably 100% or less.

The area of the first terminal 30 with respect to that of the first element terminal 40 (described later) is, for example, 80% or more, preferably 90% or more, and for example, 120% or less, preferably 110% or less.

As shown in FIG. 1, the second terminal 31 has a generally rectangular shape when viewed from the top extending in the right-left direction. The second terminal 31 is disposed so that the central portion in the right-left direction thereof is positioned on a phantom line along the front-rear direction which passes the central portion in the right-left direction of the first terminal 30.

The second terminal 31 is next to the front side with respect to the front end edge of the third stage base 20, and is disposed at spaced intervals to the rear side of the belt-shaped portion 14. That is, the second terminal 31 is next to the third stage base 20 in the front-rear direction.

The second terminal 31 extends forwardly along the front-rear direction so as to go away from the third stage base 20. The front end portion and both end portions in the right-left direction of the second terminal 31 are free end portions, and are not connected to another portion of the conductive pattern 7.

As shown in FIG. 4A, the second terminal 31 is exposed from the supporting board 5 and the base insulating layer 6 when viewed from the lower side (the other side in the thickness direction) (ref: FIG. 6C).

The range of the size of the second terminal 31 (size in the front-rear direction and size in the right-left direction) is the same as that of the size of the first terminal 30 described above. The range of the area of the second terminal 31 is the same as that of the area of the first terminal 30 described above.

A size in the front-rear direction of the second terminal 31 with respect to that in the front-rear direction of the second element terminal 41 (described later) is, for example, 80% or more, preferably 90% or more, and for example, 150% or less, preferably 120% or less, further more preferably 100% or less.

A size in the right-left direction of the second terminal 31 with respect to that in the right-left direction of the second element terminal 41 (described later) is, for example, 80% or more, preferably 90% or more, and for example, 120% or less, preferably 100% or less.

The area of the second terminal 31 with respect to that of the second element terminal 41 (described later) is, for example, 80% or more, preferably 90% or more, and for example, 120% or less, preferably 110% or less.

A plating layer 38 is provided on each of the lower surfaces of the first terminal 30 and the second terminal 31. The plating layer 38 is, for example, formed from a metal material such as nickel and gold. Preferably, the plating layer 38 is formed from gold. The plating layer 38 has a thickness of, for example, 0.1 µm or more, preferably 0.25 µm or more, and for example, 5 µm or less, preferably 2.5 µm or less.

Figure 9:
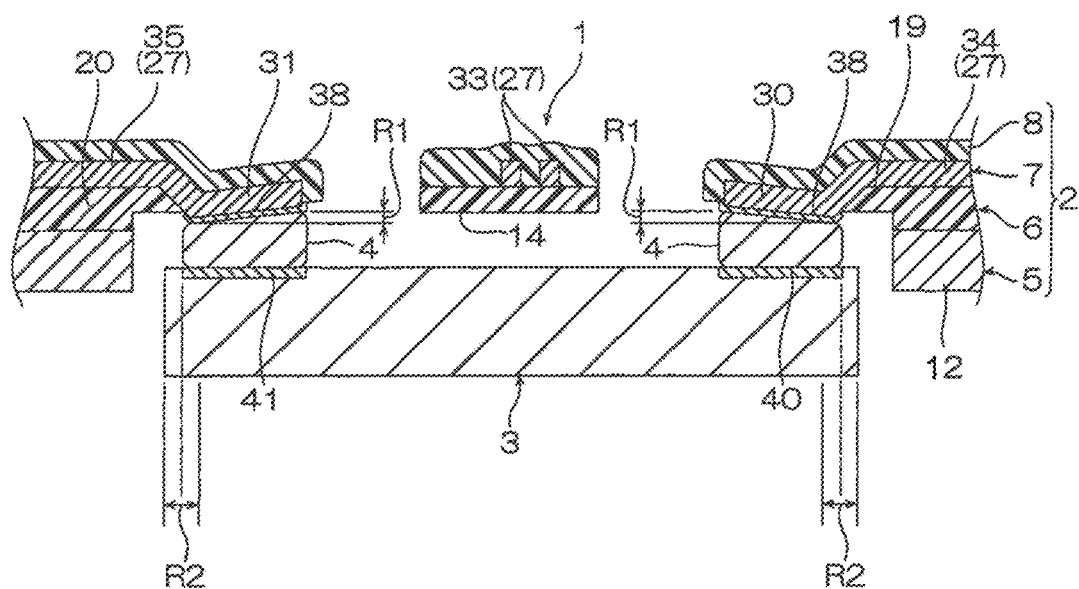
FIG. 9 shows an explanatory view for illustrating the shape and arrangement of the first terminal and the second terminal shown in FIG. 4A.

In the embodiment, each of the first terminal 30 and the second terminal 31 has a generally flat shape extending in the front-rear direction. As shown in FIG. 9, the "generally flat shape" means that an interval in the up-down direction between a portion positioned uppermost and a portion positioned lowermost of the lower surface of each of the first terminal 30 and the second terminal 31 (to be more specific, the lower surfaces of the plating layer 38) is within a range of 0 µm or more and 10 µm or less (in FIG. 9, referred to as R1). Thus, even when the first terminal 30 and the second terminal 31 slightly bend, the shape is included in the generally flat shape as long as the above-described interval is within the range R1.

As shown in FIG. 1, the power source terminals 32 correspond to the second terminals 31, and the number thereof is the same as that of the second terminal 31. In the embodiment, the two power source terminals 32 are provided corresponding to the two second terminals 31. The two power source terminals 32 are disposed between the external connecting terminals 29 in the rear end portion of the external connecting base 24. The two power source terminals 32 are disposed at spaced intervals to each other in the right-left direction.

As shown in FIG. 4A, the wire 27 is disposed on the upper surface (one side in the thickness direction) of the base insulating layer 6. As shown in FIG. 1, the wire 27 includes signal wires 33, ground wires 34, and power source wires 35.

The signal wires 33 correspond to the magnetic head terminals 28, and the number thereof is the same as that of the magnetic head terminal 28. The signal wire 33 electrically connects the magnetic head terminal 28 to the external connecting terminal 29. To be more specific, the signal wire 33 continues from the magnetic head terminal 28 and is drawn around on the first stage base 19; then, sequentially passes on the outer-side portion 21A of the bridged portion 21, the second stage base 22, the outrigger base 23, and the external connecting base 24; and thereafter, is connected to the external connecting terminal 29.

In this manner, in the embodiment, the plurality of signal wires 33 are drawn around so as to pass between the two first terminals 30 in the right-left direction.

The ground wires 34 correspond to the first terminals 30, and the number thereof is the same as that of the first terminal 30. The ground wire 34 electrically connects the first terminal 30 to the supporting board 5. To be more specific, as shown in FIGS. 1 and 4A, the ground wire 34 extends continuously from the first terminal 30 forwardly; is disposed on the first stage base 19; and then, passes through the first stage base 19 to be in contact with (grounded to) the stage 12.

As shown in FIG. 1, the power source wires 35 correspond to the second terminals 31, and the number thereof is the same as that of the second terminal 31. The power source wire 35 electrically connects the second terminal 31 to the power source terminal 32. To be more specific, as shown in FIG. 4A, the power source wire 35 extends continuously from the second terminal 31 rearwardly; is disposed on the third stage base 20; and then, as shown in FIG. 1, sequentially passes on the outrigger base 23 and the external connecting base 24 to be connected to the power source terminal 32.

The conductive pattern 7 is, for example, formed from a conductive material such as copper, nickel, gold, and solder or an alloy thereof. Preferably, the conductive pattern 7 is formed from copper.

The conductive pattern 7 has a thickness of, for example, 1 µm or more, preferably 3 µm or more, and for example, 20 µm or less, preferably 12 µm or less.

As shown in FIGS. 4A and 4B, the cover insulating layer 8 is disposed on the upper surface (one side in the thickness direction) of the base insulating layer 6 so as to cover the wire 27. The cover insulating layer 8 has a pattern shape in which the magnetic head terminal 28, the external connecting terminal 29, and the power source terminal 32 are exposed, and the first terminal 30 and the second terminal 31 are covered when viewed from the upper side (one side in the thickness direction).

The cover insulating layer 8 covers at least a portion of the peripheral end surface of the first terminal 30 and at least a portion of the peripheral end surface of the second terminal 31, in addition to the upper surface of the first terminal 30 and the upper surface of the second terminal 31.

The cover insulating layer 8 is formed from the same synthetic resin as that of the base insulating layer 6. Preferably, the cover insulating layer 8 is formed from a polyimide resin. The thickness of the cover insulating layer 8 is appropriately set.

(1-2) Piezoelectric Element

The piezoelectric element 3 is an actuator that is extendable and/or contractable in the front-rear direction. Electricity is supplied thereto and the voltage thereof is controlled, so that the piezoelectric element 3 extends and/or contracts. In the embodiment, the two piezoelectric elements 3 are mounted on the suspension board 2.

Each of the piezoelectric elements 3 is disposed at the lower side (the other side in the thickness direction) with respect to the first terminal 30 and the second terminal 31. The piezoelectric element 3 is disposed between the first terminal 30 and the second terminal 31. At the upper side of the central portion in the front-rear direction of the piezoelectric element 3, the belt-shaped portion 14 of the second stage base 22 is disposed at spaced intervals thereto.

The piezoelectric element 3 is, for example, formed from a known piezoelectric material, to be more specific, piezoelectric ceramic or the like.

Examples of the piezoelectric ceramic include $BaTiO_3$ (barium titanate), $PbTiO_3$ (lead titanate), $Pb(Zr, Ti)O_3$ (lead zirconate titanate (PZT)), $SiO_2$ (crystal), $LNbO_3$ (lithium niobate), and $PbNb_2O_6$ (lead metaniobate). Preferably, PZT is used.

The piezoelectric element 3 includes the first element terminal 40 and the second element terminal 41 as one example of an element terminal.

The first element terminal 40 and the second element terminal 41 are disposed at spaced intervals to each other in the front-rear direction corresponding to the first terminal 30 and the second terminal 31.

To be more specific, the first element terminal 40 corresponds to the first terminal 30, and is provided in the front-side portion of the upper surface of the piezoelectric element 3. The first element terminal 40 is disposed at the lower side of the first terminal 30 with the solder layer 4 sandwiched therebetween. The first element terminal 40 has a generally rectangular shape when viewed from the top extending in the right-left direction.

In the embodiment, the first element terminal 40 has the same size as that of the first terminal 30. The front end edge (outer-side edge in the direction perpendicular to the thickness direction) of the first terminal 30 generally coincides with the front end edge (outer-side edge in the direction perpendicular to the thickness direction) of the first element terminal 40 in the front-rear direction. The rear end edge (inner-side edge in the direction perpendicular to the thickness direction) of the first terminal 30 generally coincides with the rear end edge (inner-side edge in the direction perpendicular to the thickness direction) of the first element terminal 40 in the front-rear direction. That is, the size in the front-rear direction of the first terminal 30 with respect to that in the front-rear direction of the first element terminal 40 is 100%.

"Generally coincide" means that as shown in FIG. 9, the front end edge (end edge to be targeted) of the first element terminal 40 with respect to the front end edge (end edge to be reference) of the first terminal 30 is within a range of ±20 μm (referred to as R2 in FIG. 9) in the front-rear direction.

As shown in FIG. 4A, the second element terminal 41 corresponds to the second terminal 31, and is provided in the rear-side portion of the upper surface of the piezoelectric element 3. The second element terminal 41 is disposed at the lower side of the second terminal 31 with the solder layer 4 sandwiched therebetween. The second element terminal 41 has a generally rectangular shape when viewed from the top extending in the right-left direction.

The range of the size (size in the front-rear direction and size in the right-left direction) of the second element terminal 41 is the same as that of the size of the first element terminal 40 described above.

In the embodiment, the second element terminal 41 has the same size as that of the second terminal 31. The rear end edge (outer-side edge in the direction perpendicular to the thickness direction) of the second terminal 31 generally coincides with the rear end edge (outer-side edge in the direction perpendicular to the thickness direction) of the second element terminal 41 in the front-rear direction. The front end edge (inner-side edge in the direction perpendicular to the thickness direction) of the second terminal 31 generally coincides with the front end edge (inner-side edge in the direction perpendicular to the thickness direction) of the second element terminal 41 in the front-rear direction. That is, the size in the front-rear direction of the second terminal 31 with respect to that in the front-rear direction of the second element terminal 41 is 100%.

(1-3) Solder Layer

As shown in FIGS. 4A and 4B, the solder layer 4 is disposed between the first terminal 30 (to be more specific, the plating layer 38 of the first terminal 30) and the first element terminal 40, and the second terminal 31 (to be more specific, the plating layer 38 of the second terminal 31) and the second element terminal 41.

In this manner, the first terminal 30 is electrically connected to the first element terminal 40, and the second terminal 31 is electrically connected to the second element terminal 41.

The solder layer 4 has a solder composition containing Sn, Ag, and Cu (hereinafter, referred to as a Sn—Ag—Cu solder composition). Preferably, the solder composition consists of only Sn, Ag, and Cu.

In the Sn—Ag—Cu solder composition, the content ratio of Ag is, for example, 1 mass % or more, preferably 2 mass % or more, and for example, 5 mass % or less, preferably 4 mass % or less, further more preferably 3 mass % or less.

The content ratio (Ag/Cu) of Ag to Cu is, for example, 4 or more, preferably 5 or more, and for example, 8 or less, preferably 7 or less.

In the Sn—Ag—Cu solder composition, the content ratio of Cu is, for example, 0.3 mass % or more, preferably 0.4 mass % or more, and for example, 0.7 mass % or less, preferably 0.6 mass % or less, further more preferably 0.5 mass % or less.

In the Sn—Ag—Cu solder composition, the content ratio of Sn is the remaining content ratio of the above-described Ag and Cu.

To be specific, an example of the solder composition includes Sn-3Ag-0.5Cu. A commercially available product can be used as the solder composition.

The melting point of the solder composition is, for example, 200° C. or more, preferably 210° C. or more, and for example, 230° C. or less, preferably 220° C. or less.

As shown in FIG. 4A, the solder layer 4 has a thickness T of for example, 3 μm or more, preferably 10 μm or more, further more preferably 15 μm or more, and for example, 50 μm or less, preferably 40 μm or less, further more preferably 30 μm or less, particularly preferably 25 μm or less.

The volume of the solder layer 4 that is positioned between the first terminal 30 and the first element terminal 40 is, for example, $1 \times 10^{-8}$ cm$^3$ or more, preferably $1 \times 10^{-7}$ cm$^3$ or more, and for example, $1 \times 10^{-5}$ cm$^3$ or less, preferably $1 \times 10^{-6}$ cm$^3$ or less.

When the volume of the solder layer 4 is the above-described lower limit or more, the piezoelectric element 3 can be surely self-aligned, and improvement of the position accuracy of the piezoelectric element 3 can be achieved. When the volume of the solder layer 4 is the above-described upper limit or less, a reduction in the thickness T of the solder layer 4 can be surely achieved.

The range of the volume of the solder layer 4 that is positioned between the second terminal 31 and the second element terminal 41 is the same as that of the volume of the solder layer 4 that is positioned between the first terminal 30 and the first element terminal 40 described above.

The external connecting portion 11 (ref: FIG. 2) of the supporting board 5 is supported by the load beam 43, so that the suspension board with circuit 1 is mounted on a hard disk drive (not shown). At this time, the front end portion of the load beam 43 is positioned at the lower side (the other side in the thickness direction) with respect to the piezoelectric element 3.

Thus, when the thickness T of the solder layer 4 is above the above-described range, the piezoelectric element 3 is brought into contact with the load beam 43. Meanwhile, when the thickness T of the solder layer 4 is within the above-described range, improvement of the position accuracy of the piezoelectric element 3 can be achieved, and contact of the piezoelectric element 3 with the load beam 43 can be suppressed.

2. Method for Producing Suspension Board with Circuit

Next, a method for producing the suspension board with circuit 1 is described with reference to FIGS. 5A to 7C.

To produce the suspension board with circuit 1, as shown in FIGS. 5A to 6C, first the suspension board 2 is prepared.

Figure 5A:
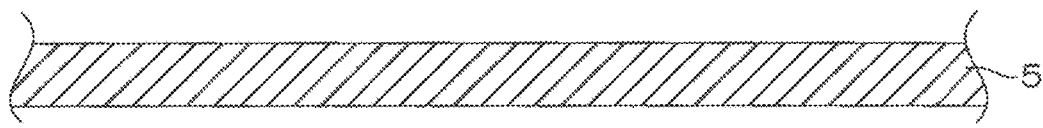
FIG. 5A shows an explanatory view for illustrating a step of preparing a suspension board shown in FIG. 1 and shows a step of preparing a supporting board.

To prepare the suspension board 2, as shown in FIG. 5A, the supporting board 5 is prepared.

Figure 5B:
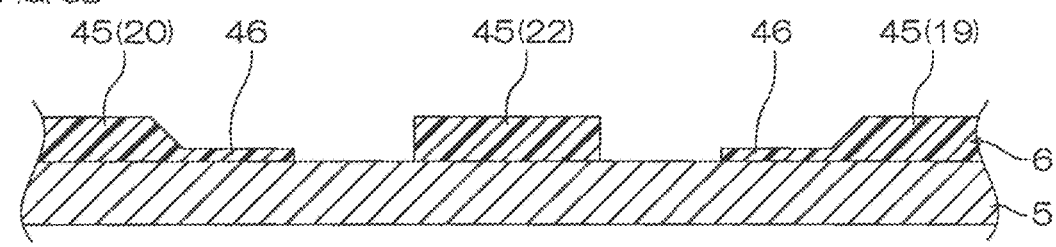
FIG. 5B, subsequent to FIG. 5A, shows a step of forming a base insulating layer including a thick portion and a thin portion on the supporting board.

Next, as shown in FIG. 5B, the base insulating layer 6 is formed on the upper surface (one side in the thickness direction) of the supporting board 5 so as to form a thick portion 45 and thin portions 46 by a gradation exposure to light.

To be specific, a varnish containing a photosensitive synthetic resin is applied onto the supporting board 5 to be then dried, thereby forming a base film. Thereafter, the base film is subjected to the gradation exposure to light via a photomask that is not shown; then, the base film is developed; and is cured by heating as needed.

In this manner, the thick portion 45 is formed in the portions corresponding to the above-described base insulating layer 6 (the first stage base 19, the second stage base 22, the third stage base 20, the outrigger base 23, and the external connecting base 24). The thin portions 46 are formed in the portions corresponding to the first terminals 30 and the second terminals 31 described above.

Figure 5C:
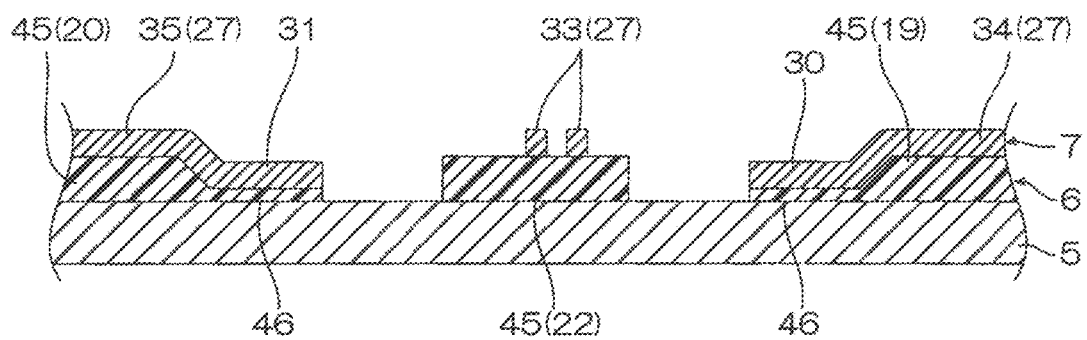
FIG. 5C, subsequent to FIG. 5B, shows a step of forming a conductive pattern on the base insulating layer.

Next, as shown in FIG. 5C, the conductive pattern 7 is formed on the base insulating layer 6 (the thick portion 45 and the thin portions 46) in the above-described pattern by, for example, an additive method or a subtractive method.

To be specific, the wire 27, the magnetic head terminal 28, the external connecting terminal 29, and the power source terminal 32 are formed on the upper surface (surface at one side in the thickness direction) of the thick portion 45, and the first terminal 30 and the second terminal 31 are formed on the upper surface (surface at one side in the thickness direction) of the thin portions 46.

Figure 5D:
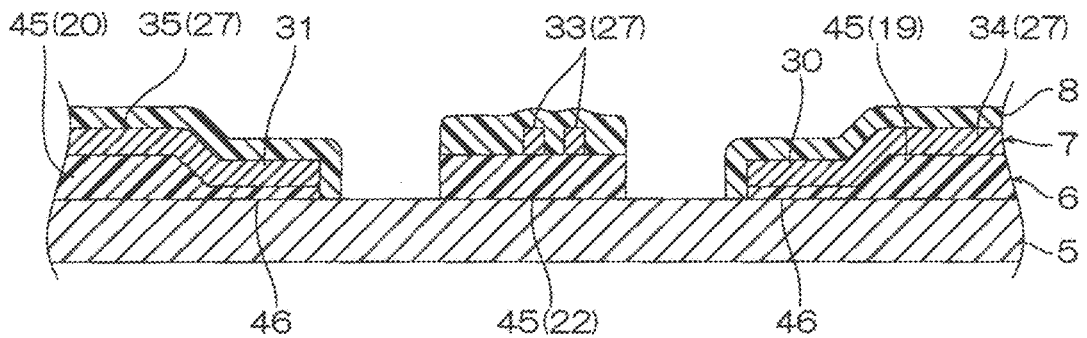
FIG. 5D, subsequent to FIG. 5C, shows a step of forming a cover insulating layer on the base insulating layer so as to cover a wire.

Next, as shown in FIG. 5D, the cover insulating layer 8 is formed on the upper surface (one side in the thickness direction) of the base insulating layer 6 in the above-described pattern.

To be specific, a varnish containing a photosensitive synthetic resin is applied onto the base insulating layer 6 and the conductive pattern 7 (excluding the magnetic head terminal 28, the external connecting terminal 29, and the power source terminal 32) to be then dried, thereby forming a cover film. Thereafter, the cover film is exposed to light to be developed, and is cured by heating as needed.

In this manner, the cover insulating layer 8 is formed so as to cover the wire 27, the first terminal 30, and the second terminal 31 and to expose the magnetic head terminal 28, the external connecting terminal 29, and the power source terminal 32.

Next, as shown in FIG. 6A, the supporting board 5 is trimmed so as to have the above-described pattern. In this manner, the supporting board 5 that is positioned at the lower side of the thin portion 46 is removed, and the thin portion 46 is exposed from the lower side thereof.

Next, as shown in FIG. 6B, the thin portion 46 is removed by known etching (for example, wet etching or the like). In this manner, the lower surfaces of the first terminal 30 and the second terminal 31 are exposed from the base insulating layer 6.

Next, as shown in FIG. 6C, the plating layer 38 is formed on the lower surfaces of the first terminal 30 and the second terminal 31 by a known plating method (for example, electrolytic plating, nonelectrolytic plating, or the like).

In this manner, the suspension board 2 is prepared.

Figure 7A:
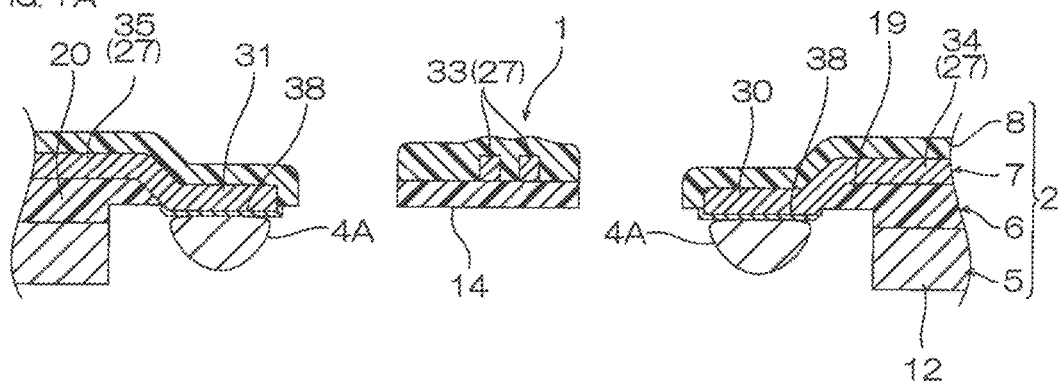
FIG. 7A shows an explanatory view for illustrating a step of mounting a piezoelectric element on the suspension board shown in FIG. 6C, and shows a step of disposing a solder composition on the first terminal and the second terminal.

Next, as shown in FIG. 7A, the Sn—Ag—Cu solder composition 4A is disposed on the lower surface of the plating layer 38 of the first terminal 30 and the lower surface of the plating layer 38 of the second terminal 31 by a known method (for example, printing with a known printer, application with a dispenser, or the like).

At this time, the solder composition 4A has the maximum thickness of, for example, 10 µm or more, preferably 20 µm or more, and for example, 60 µm or less, preferably 50 µm or less.

Figure 7B:
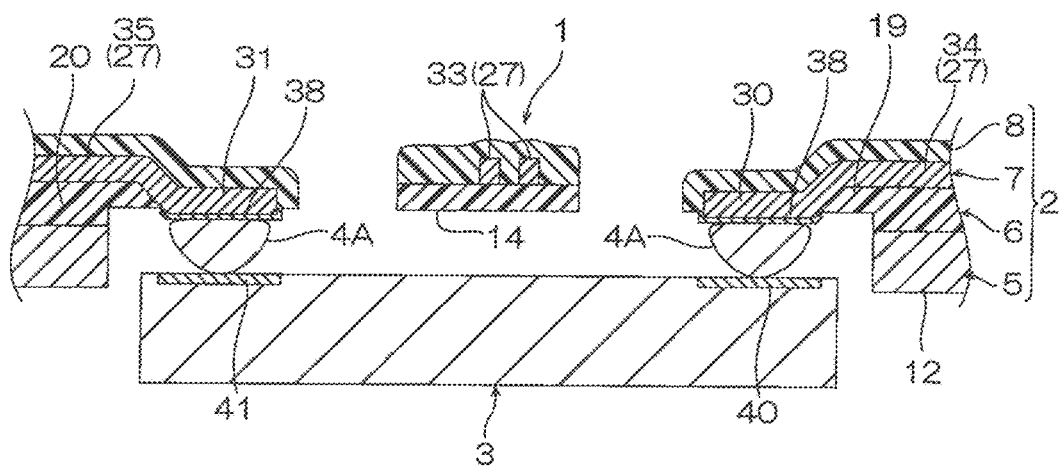
FIG. 7B, subsequent to FIG. 7A, shows a step of disposing the piezoelectric element so that a first element terminal and a second element terminal are in contact with the solder composition.

Next, as shown in FIG. 7B, the piezoelectric element 3 is disposed so that the first element terminal 40 is in contact with the solder composition 4A on the first terminal 30, and the second element terminal 41 is in contact with the solder composition 4A on the second terminal 31.

Figure 7C:
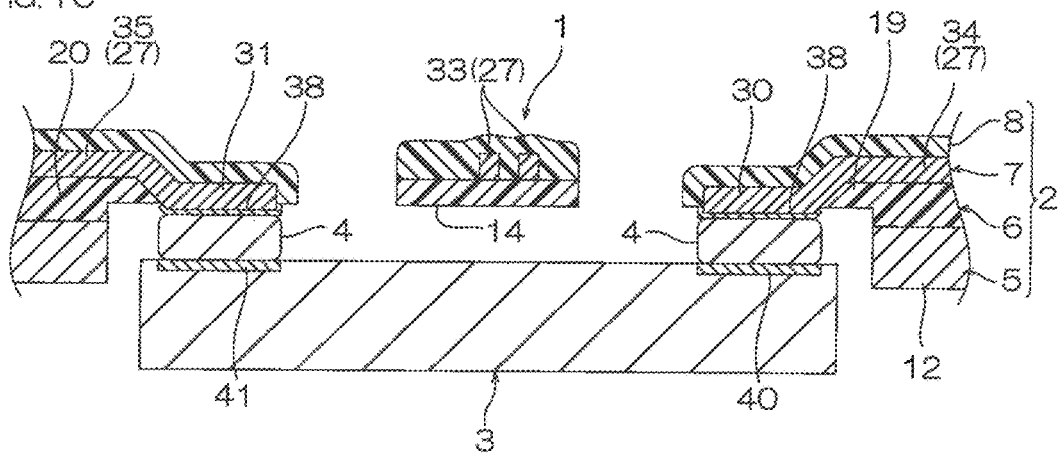
FIG. 7C, subsequent to FIG. 7B, shows a step of forming a solder layer by melting the solder composition.

Next, as shown in FIG. 7C, the suspension board 2 on which the piezoelectric element 3 is disposed is subjected to reflow.

The reflow temperature is, for example, 230° C. or more, preferably 240° C. or more, and for example, 260° C. or less, preferably 250° C. or less. The reflow time is, for example, 3 seconds or more, preferably 5 seconds or more, and for example, 300 seconds or less, preferably 200 seconds or less.

In this manner, the solder composition 4A is melted so as to wet-spread on each of the entire lower surfaces of the first terminal 30 and the second terminal 31, so that the piezoelectric element 3 is self-aligned.

Figure 8:
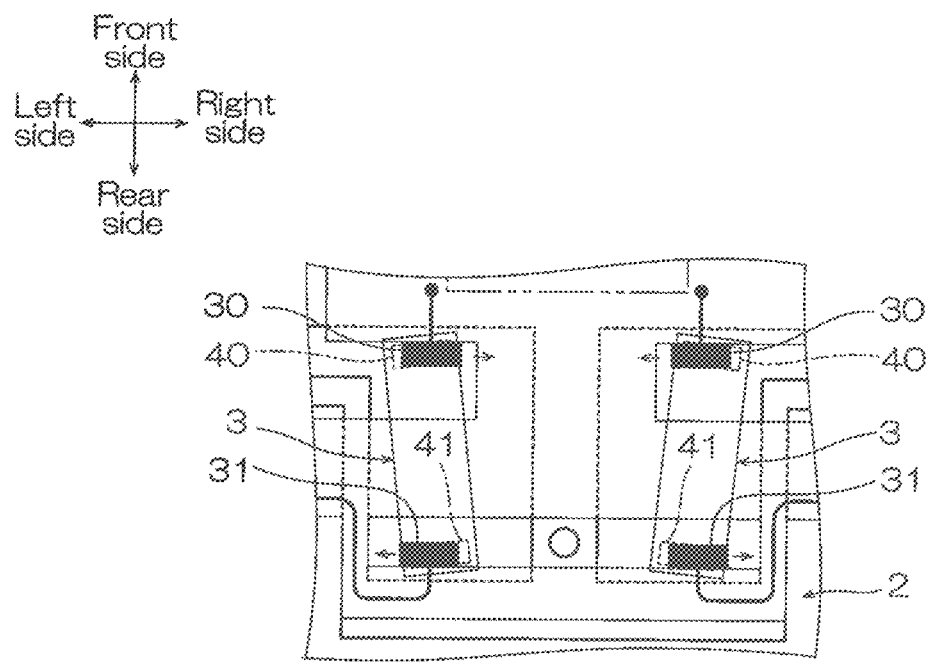
FIG. 8 shows an explanatory view for illustrating self-alignment of the piezoelectric element shown in FIG. 7C.

To be more specific, in the step of disposing the piezoelectric element 3 shown in FIG. 7B, as shown in FIG. 8, there may be a case where the piezoelectric element 3 deviates from a predetermined position, and is disposed so as to incline in the right-left direction. In this case, the center of the first element terminal 40 deviates from that of the first terminal 30, and the center of the second element terminal 41 deviates from that of the second terminal 31 when viewed in the up-down direction.

Next, when the suspension board 2 on which the piezoelectric element 3 is disposed is subjected to reflow, the solder composition 4A is melted so as to wet-spread on each of the entire lower surfaces of the first terminal 30 and the second terminal 31 (ref: FIGS. 7B and 7C).

At this time, by the surface tension of the melted solder composition 4A, power is applied to the piezoelectric element 3 so that the center of the first element terminal 40 coincides with the center of the first terminal 30, and the center of the second element terminal 41 coincides with the center of the second terminal 31 when viewed in the up-down direction. In this manner, as shown in FIG. 2, the piezoelectric element 3 is self-aligned from a state where it deviates from the predetermined position toward the predetermined position.

As shown in FIG. 7C, the solder composition 4A forms the solder layer 4, and connects the first terminal 30 to the first element terminal 40 and connects the second terminal 31 to the second element terminal 41.

In the above-described manner, the suspension board with circuit 1 including the suspension board 2 and the piezoelectric elements 3 is produced.

As shown in FIG. 1, the suspension board with circuit 1 may or may not include the slider 9 that has a magnetic head. When the suspension board with circuit 1 includes the slider 9, the slider 9 is disposed at the upper side (one side in the thickness direction) with respect to the first stage base 19. That is, the slider 9 is disposed at the opposite side to the piezoelectric element 3 with respect to the suspension board 2.

As shown in FIG. 4A, the solder layer 4 has the Sn—Ag—Cu solder composition. Thus, improvement of the surface tension of the solder composition can be achieved, and the self-alignment of the piezoelectric element 3 can be achieved with a small amount of solder composition.

As a result, improvement of the position accuracy of the piezoelectric element 3 can be achieved, the thickness T of the solder layer 4 can be reduced to 50 μm or less, and therefore, a reduction in the thickness of the portion on which the piezoelectric element 3 is mounted can be achieved.

Also, the first terminal 30 extends rearwardly along the front-rear direction so as to go away from the first stage base 19 next thereto. The second terminal 31 extends forwardly along the front-rear direction so as to go away from the third stage base 20 next thereto.

That is, the base insulating layer 6 is not disposed on the first terminal 30 and the second terminal 31, and is not positioned between the first terminal 30 and the second terminal 31, and the piezoelectric element 3 in the up-down direction.

Thus, in the suspension board with circuit 1, a reduction in the thickness of the portion on which the piezoelectric element 3 is mounted can be surely achieved.

As shown in FIGS. 7A to 7C, the Sn—Ag—Cu solder composition 4A is disposed on the first terminal 30 and the second terminal 31; next, the piezoelectric element 3 is disposed so that the first element terminal 40 and the second element terminal 41 are in contact with the solder composition 4A; subsequently, the piezoelectric element 3 is self-aligned by heating the solder composition 4A to be melted; and the first element terminal 40 and the second element terminal 41 are connected to the first terminal 30 and the second terminal 31, respectively.

Thus, the suspension board with circuit 1 in which the position accuracy of the piezoelectric element 3 is excellent, and the thickness of the portion on which the piezoelectric element 3 is mounted is reduced can be smoothly produced.

3. Second Embodiment

Next, a second embodiment of the present invention is described with reference to FIG. 10. In the second embodiment, the same reference numerals are provided for members corresponding to each of those in the above-described first embodiment, and their detailed description is omitted.

In the first embodiment, as shown in FIG. 4A, the size in the front-rear direction of the first terminal 30 with respect to that in the front-rear direction of the first element terminal 40 is 100%, and the size in the front-rear direction of the second terminal 31 with respect to that in the front-rear direction of the second element terminal 41 is 100%, but the ratio is not limited thereto.

Figure 10:
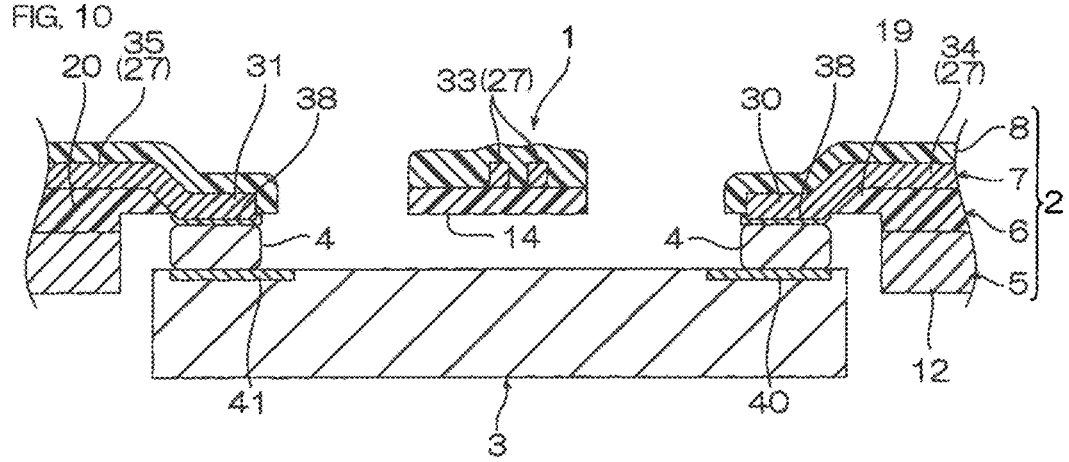
FIG. 10 shows a cross-sectional view corresponding to the A-A cross section of FIG. 2 in a second embodiment of the present invention.

In the second embodiment, as shown in FIG. 10, the front end edge of the first terminal 30 generally coincides with that of the first element terminal 40 in the front-rear direction. The size in the front-rear direction of the first terminal 30 with respect to that in the front-rear direction of the first element terminal 40 is, below 100%, preferably 80% or less, further more preferably 70% or less, and for example, 30% or more.

Also, the rear end edge of the second terminal 31 generally coincides with that of the second element terminal 41 in the front-rear direction. The size in the front-rear direction of the second terminal 31 with respect to that in the front-rear direction of the second element terminal 41 is, below 100%, preferably 90% or less, and for example, 30% or more.

According to the second embodiment, the size in the front-rear direction of the first terminal 30 with respect to that in the front-rear direction of the first element terminal 40 is below 100%, and the size in the front-rear direction of the second terminal 31 with respect to that in the front-rear direction of the second element terminal 41 is below 100%.

In this case, the center of the first terminal 30 is positioned at the front side (outer side in the front-rear direction) with respect to the center of the first element terminal 40, and the center of the second terminal 31 is positioned at the rear side (outer side in the front-rear direction) with respect to the center of the second element terminal 41.

Thus, when the piezoelectric element 3 is self-aligned, the first element terminal 40 and the second element terminal 41 are pulled outwardly in the front-rear direction. As a result, improvement of the position accuracy of the piezoelectric element 3 can be further more surely achieved.

In the second embodiment, the same function and effect as that of the first embodiment can be achieved.

EXAMPLES

In the following, the present invention will be described in detail with Examples and Comparative Examples, but the present invention is not limited thereto. The specific numerical values in mixing ratio (content ratio), property value, and parameter used in the following description will be replaced with upper limits (numerical values defined as "or less" or "below") or lower limits (numerical values defined as "or more" or "above") of corresponding numerical values in mixing ratio (content ratio), property value, and parameter described in the above-described "DETAILED DESCRIPTION OF THE INVENTION".

Examples 1 to 4

Suspension boards with circuit, each of which included two pairs of first terminal (size in the front-rear direction of the terminal/size in the front-rear direction of the element terminal: 100%, size in the right-left direction of the terminal/size in the right-left direction of the element terminal: 90%) and second terminal (size in the front-rear direction of the terminal/size in the front-rear direction of the element terminal: 100%, size in the right-left direction of the terminal/size in the right-left direction of the element terminal: 100%), were prepared.

Next, a Sn—Ag—Cu solder composition (Sn content ratio: remaining portion, Ag content ratio: 3±1 mass %, Cu content ratio: 0.5±0.1 mass %) was disposed on each of the lower surfaces of the first terminal and the second terminal.

Next, two piezoelectric elements, each of which included a first element terminal and a second element terminal, were prepared, and each of the piezoelectric elements was disposed so that the first element terminal was in contact with the solder composition on the first terminal, and the second element terminal was in contact with the solder composition on the second terminal.

Next, the suspension board on which the piezoelectric elements were disposed was put into a reflow oven and heated at 240° C. for 15 seconds. In this manner, the solder composition was melted so as to wet-spread on each of the entire lower surfaces of the first terminal and the second terminal, so that the piezoelectric element was self-aligned.

Thereafter, the solder composition formed a solder layer, and the first terminal was connected to the first element terminal and the second terminal was connected to the second element terminal.

In the above-described manner, the suspension board with circuit including the suspension board and the piezoelectric elements was obtained. The same procedure was repeated, and twenty suspension boards with circuit were prepared.

The range of the thickness of the solder layer in the plurality of suspension boards with circuit is shown in the following Table 1.

Comparative Examples 1 to 5

A plurality of suspension boards with circuit were obtained in the same manner as that of Examples 1 to 4, except that the Sn—Ag—Cu solder composition was changed to a Sn—Bi—Cu—Ni solder composition (Sn content ratio: remaining portion, Bi content ratio: 40±1 mass %, Cu content ratio: 0.5±0.1 mass %, Ni content ratio: 0.03±0.01 mass %).

Examples 5 to 10

A plurality of suspension boards with circuit were obtained in the same manner as that of Example 3, except that the size of the first terminal and the second terminal was changed to that shown in the following Table 2.

<Evaluation>

In the following manner, the process capability index (Cpk) of each of the suspension boards with circuit of Examples and Comparative Examples was calculated. The Cpk shows the capacity of producing a product within a determined standard limit. The higher the numerical value is, the higher the production capacity is.

Based on the position of a first reference hole and a second reference hole, a Y-axis reference line (phantom line passing the center in the right-left direction of the suspension board with circuit along the front-rear direction) of the suspension board with circuit was specified.

Next, an X-axis reference line (phantom line passing the center of the first reference hole along the right-left direction) that was vertical to the Y-axis reference line and passed the center of the first reference hole was specified. The center of the first reference hole was defined as the reference (0, 0).

Next, a first phantom line along both end edges in the right-left direction of the piezoelectric element was extracted. Then, the angle (inclination θ) formed between the first phantom line (both end edges in the right-left direction of the piezoelectric element) and the Y-axis reference line was measured.

Next, a second phantom line along both end edges in the front-rear direction of the piezoelectric element was extracted. Then, the apexes (four corners) of the piezoelectric element were extracted from the intersection point of the first phantom line and the second phantom line.

Next, the central coordinate of the piezoelectric element was calculated from the coordinates of the apexes of the piezoelectric element. Then, the amount of deviation (amount of deviation of X-coordinate, amount of deviation of Y-coordinate) of the central coordinate of the piezoelectric element was calculated from the reference point (center of the first reference hole). Next, the average value of the inclination θ, the amount of deviation of X-coordinate, the amount of deviation of Y-coordinate in the plurality of suspension boards with circuit was calculated.

Also, the magnitude of dispersion (σ, standard deviation) of data of the inclination θ, the amount of deviation of X-coordinate, the amount of deviation of Y-coordinate was calculated.

Next, of the following formulas (1) and (2), the one having a smaller value was defined as Cpk. The results are shown in Tables 1 and 2, and FIGS. 11 and 12.

(upper limit standard−average value)/3σ=Cpu     Formula (1)

(lower limit standard−average value)/3σ=Cpl     Formula (2)

TABLE 1

| no. | | Ex. 1 | Ex. 2 | Ex. 3 | Ex. 4 | Comp. Ex. 1 | Comp. Ex. 2 | Comp. Ex. 3 | Comp. Ex. 4 | Comp. Ex. 5 |
|---|---|---|---|---|---|---|---|---|---|---|
| Solder Composition | | Sn—Ag—Cu Solder Composition | | | | Sn—Bi—Cu—Ni Solder Composition | | | | |
| Thickness of Solder Layer (μm) | | 5-15 | 10-20 | 15-25 | 20-30 | 5-15 | 10-20 | 15-25 | 20-30 | 25-35 |
| Cpk (—) | X-coordinate | 0.52 | 0.89 | 4.70 | 4.76 | 0.82 | 1.21 | 1.33 | 1.25 | 0.99 |
| | Y-coordinate | 0.90 | 0.87 | 1.53 | 1.61 | 0.56 | 0.49 | 0.88 | 0.67 | 0.52 |
| | Inclination θ | 0.41 | 0.70 | 1.12 | 1.49 | 0.28 | 0.15 | 0.15 | 0.41 | 0.67 |

TABLE 2

| no. | | Ex. 5 | Ex. 6 | Ex. 7 | Ex. 8 | Ex. 9 |
|---|---|---|---|---|---|---|
| Size in Front-Rear Direction of First Terminal/Size in Front-Rear Direction of First Element Terminal × 100 [%] | | 125 | 113 | 106 | 100 | 63 |
| Size in Right-Left Direction of First Terminal/Size in Right-Left Direction of First Element Terminal × 100 [%] | | 96 | 96 | 65 | 96 | 96 |
| Size in Front-Rear Direction of Second Terminal/Size in Front-Rear Direction of Second Element Terminal × 100 [%] | | 113 | 113 | 113 | 113 | 113 |
| Size in Right-Left Direction of Second Terminal/Size in Right-Left Direction of Second Element Terminal × 100 [%] | | 100 | 100 | 100 | 100 | 100 |
| Solder Layer | | Sn—Ag—Cu Solder Composition | | | | |
| Thickness of Solder Layer (μm) | | 15-25 | | | | |
| Cpk (—) | X-coordinate | 4.02 | 4.22 | 1.80 | 5.11 | 6.65 |
| | Y-coordinate | 0.19 | 3.67 | 4.47 | 9.41 | 8.76 |
| | Inclination θ | 1.77 | 2.00 | 0.99 | 5.05 | 3.01 |

<Consideration>

Figure 11:
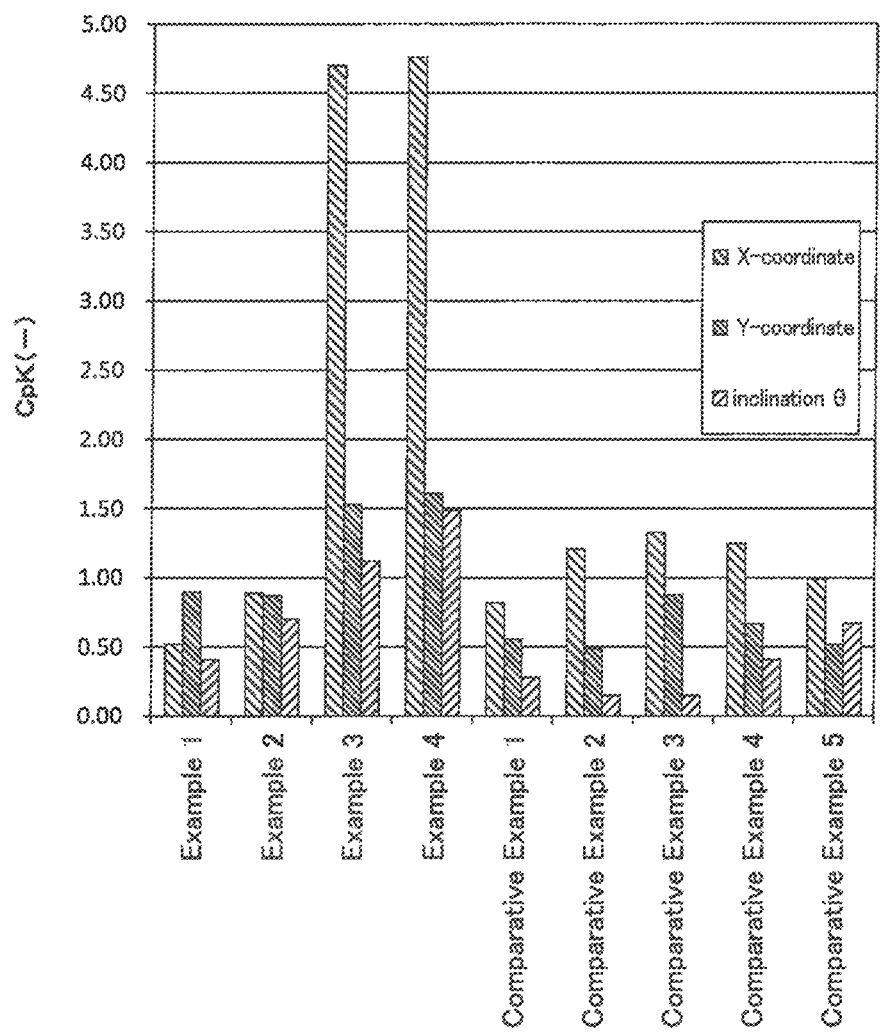
FIG. 11 shows a graph showing the process capability index (Cpk) of the suspension boards with circuit of Examples 1 to 4 and Comparative Examples 1 to 5.

As shown in Table 1 and FIG. 11, it was confirmed that compared to Comparative Examples 1 to 5, in Examples 1 to 4, a reduction in the thickness of the solder layer can be achieved, and the high Cpk could be ensured.

To be specific, the Cpk (0.70) of the inclination θ in Example 2 was almost the same as the Cpk (0.67) of the inclination θ in Comparative Example 5. However, in Example 2, the thickness of the solder layer was 10 to 20 μm, and it was confirmed that compared to Comparative Example 5 (25 to 35 μm of the thickness of the solder layer), the thickness of the portion on which the piezoelectric element was mounted could be reduced.

Also, it was confirmed that when the thickness of the solder layer was 15 μm or more (Examples 3 and 4), 1.12 or more could be ensured in all the Cpk (X-coordinate, Y-coordinate, and inclination θ).

Figure 12:
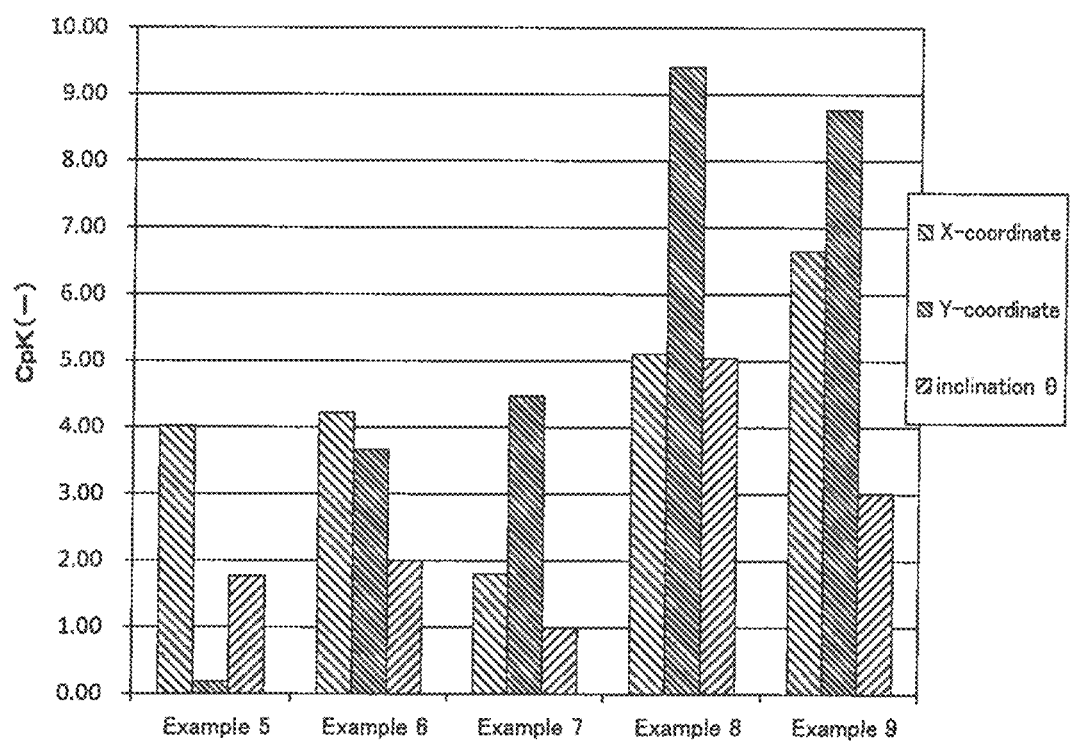
FIG. 12 shows a graph showing the process capability index (Cpk) of the suspension boards with circuit of Examples 5 to 9.

As shown in Table 2 and FIG. 12, it was confirmed that when the ratio of the size in the front-rear direction of the first terminal with respect to the size in the front-rear direction of the first element terminal was 100% or less (Examples 8 and 9), improvement of the Cpk could be further more achieved.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
a metal supporting layer,
a base insulating layer disposed at one side in a thickness direction of the metal supporting layer,
a conductive pattern including a wire disposed at one side in the thickness direction of the base insulating layer and at least one terminal exposed from the metal supporting layer and the base insulating layer when viewed from the other side in the thickness direction,
a piezoelectric element disposed at the other side in the thickness direction with respect to the at least one terminal and including at least one piezoelectric element terminal electrically connected to the at least one terminal, and
a solder layer disposed between the at least one terminal and the at least one piezoelectric element terminal, wherein
the solder layer has a solder composition containing Sn, Ag, and Cu,
the solder layer has a thickness in the thickness direction of 50 μm or less, and
a volume of the solder layer is $1\times10^{-7}$ cm$^3$ or more and $1\times10^{-6}$ cm$^3$ or less.

2. The suspension board with circuit according to claim 1, wherein
the at least one terminal comprises two terminals disposed at spaced intervals to each other in a direction perpendicular to the thickness direction,
the at least one piezoelectric element terminal comprises two piezoelectric element terminals corresponding to the two terminals and disposed at spaced intervals to each other in the direction perpendicular to the thickness direction,
an outer-side end edge in the direction perpendicular to the thickness direction of each of the two terminals generally coincides with that in the direction perpendicular to the thickness direction of each of the two piezoelectric element terminals in the direction perpendicular to the thickness direction, and
a size in the direction perpendicular to the thickness direction of each of the two terminals with respect to that in the direction perpendicular to the thickness direction of each of the two piezoelectric element terminals is 30% or more and 100% or less.

3. The suspension board with circuit according to claim 1, wherein
the at least one terminal is next to the base insulating layer in a direction perpendicular to the thickness direction and extends along the direction perpendicular to the thickness direction so as to go away from the base insulating layer next thereto.

\* \* \* \* \*